US009202894B1

United States Patent
Zang

(10) Patent No.: US 9,202,894 B1
(45) Date of Patent: Dec. 1, 2015

(54) METHODS FOR FORMING SEMICONDUCTOR FIN SUPPORT STRUCTURES

(71) Applicant: GLOBALFOUNDRIES Inc., Grand Cayman (KY)

(72) Inventor: Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 33 days.

(21) Appl. No.: 14/286,144

(22) Filed: May 23, 2014

(51) Int. Cl.
*H01L 29/66* (2006.01)
*H01L 29/423* (2006.01)

(52) U.S. Cl.
CPC .... *H01L 29/66795* (2013.01); *H01L 29/42392* (2013.01)

(58) Field of Classification Search
CPC ...... H01L 29/78; H01L 21/306; H01L 21/762
USPC ............................. 438/254, 479, 714; 257/192
See application file for complete search history.

(56) References Cited

U.S. PATENT DOCUMENTS

2012/0129354 A1* 5/2012 Luong ........................... 438/714

* cited by examiner

*Primary Examiner* — Sheng Zhu
(74) *Attorney, Agent, or Firm* — Amerson Law Firm, PLLC

(57) ABSTRACT

One method includes forming trenches that define a fin structure including a first layer of a first semiconductor material and a second layer of a second semiconductor material positioned above a substrate, performing at least one etching process that exposes opposing end surfaces of the first and second layers, performing at least one recess etching process that removes end portions of the first layer and defines a cavity on opposite ends of the first layer, performing an epitaxial deposition process that fills each of the cavities with a support structure including a third semiconductor material, and performing an etching process to selectively remove remaining portions of the recessed first layer relative to the second layer and the support structures, the end portions of the second layer and the support structures defining pillars on opposite ends of the fin structure.

20 Claims, 11 Drawing Sheets

METHODS FOR FORMING SEMICONDUCTOR FIN SUPPORT STRUCTURES

BACKGROUND

1. Field of the Disclosure

Generally, the present disclosure relates to methods of forming semiconductor devices, and, more particularly, to various methods of forming semiconductor fin support structures.

2. Description of the Related Art

The fabrication of advanced integrated circuits, such as CPUs (central processing units), storage devices, ASICs (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate structure positioned above the channel region. These elements are sometimes referred to as the source, drain, channel and gate, respectively. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region. To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and prevent the channel from being adversely affected by the electrical potential of the drain. This is sometimes referred to as a short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed, and a gate electrode encloses both sides and an upper surface of the fin-shaped active area to form a tri-gate structure so as to form a channel region having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device.

Another form of 3D semiconductor device employs so-called nanowire structures for the channel region of the device. There are several known techniques for forming such nanowire structures. As the name implies, at the completion of the fabrication process, the nanowire structures typically have a generally circular cross-sectional configuration. Nanowire devices are considered to be one option for solving the constant and continuous demand for semiconductor devices with smaller feature sizes. However, the manufacture of nanowire devices involves the performance of many complicated process operations. Specifically, the layers of material in the channel structure of nanowire devices, including the layers that become the nanowires themselves, are subject to many processing techniques, such as deposition, etching, doping and the like. Some of these processes may weaken the integrity of the channel structure or undesirably damage source and drain regions of devices. The present disclosure is directed to various methods to improve the integrity of the channel structure and prevent undesirable damage during and after such processing.

SUMMARY

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to methods of forming semiconductor fin support structures. One illustrative method disclosed herein includes forming trenches that define a fin structure including a first layer of a first semiconductor material and a second layer of a second semiconductor material positioned above a substrate. The first and second semiconductor materials are selectively etchable relative to one another. The method further includes performing at least one etching process that exposes opposing end surfaces of the first and the second layers. The method further includes performing at least one recess etching process that removes end portions of the first layer and defines a cavity on opposite ends of the first layer. The cavities are positioned vertically adjacent to end portions of the second layer. The method further includes performing an epitaxial deposition process that fills each of the cavities with a support structure including a third semiconductor material. The method further includes performing an etching process to selectively remove remaining portions of the recessed first layer relative to the second layer and the support structures. The end portions of the second layer and the support structures define pillars on opposite ends of the fin structure.

Another illustrative method disclosed herein includes performing at least one recess etching process that removes end portions of a first layer of a first semiconductor material and defines a cavity on opposite ends of the first layer. The cavities are positioned vertically adjacent to end portions of a second layer of a second semiconductor material, and a fin structure includes the first and second layer. The method further includes performing an epitaxial deposition process that fills each of the cavities with a support structure including a third semiconductor material. The method further includes performing an etching process to selectively remove remaining portions of the recessed first layer relative to the second layer and the support structures. The end portions of the second layer and the support structures define pillars on opposite ends of the fin structure.

Another illustrative method disclosed herein includes forming a plurality of trenches that define a fin structure including a first layer of a first semiconductor material and a second layer of a second semiconductor material positioned above a substrate. The first and second semiconductor materials are selectively etchable relative to one another. The method further includes performing at least one etching process that exposes opposing end surfaces of the first and the second layers. The method further includes performing at least one recess etching process that removes end portions of the first layer and defines a cavity on opposite ends of the first layer. The cavities are positioned vertically adjacent to end portions of the second layer. The method further includes performing an epitaxial deposition process that fills each of the cavities with a support structure including a third semiconductor material. The method further includes performing an etching process to selectively remove remaining portions of the recessed first layer relative to the second layer and the support structures.

BRIEF DESCRIPTION OF THE DRAWINGS

The disclosure may be understood by reference to the following description taken in conjunction with the accompanying drawings, in which like reference numerals identify like elements, and in which.

Figure 1A:
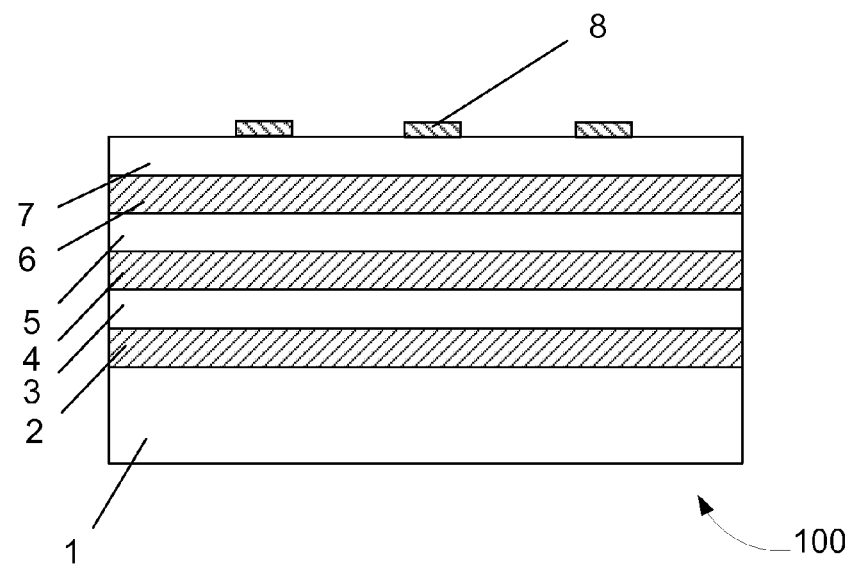
FIGS. 1A-1O depict an illustrative method of forming semiconductor fin support structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein in an open-ended fashion, and thus mean "including, but not limited to."

DETAILED DESCRIPTION

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to methods of forming semiconductor fin support structures. As will be readily apparent, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In the depicted examples, a wafer portion 100 will be disclosed in the context of performing FinFET formation techniques. However, the present disclosure should not be considered to be limited to the examples depicted herein. The substrate 1 may include a variety of configurations, such as a bulk silicon configuration or an SOI (silicon-on-insulator) configuration. Thus, the terms "substrate" or "semiconducting substrate" should be understood to cover all substrate configurations. The substrate 1 may also be made of materials other than silicon. Additionally, the number of fins 102 (see FIG. 1B) on the wafer portion 100 may differ from the number of fins 102 described and shown herein. For simplicity, the shapes in the figures are shown as rectangular with sharp corners. However, if desired, the corners may have a more rounded configuration due to deposition or etching processes.

FIG. 1A is a simplified cross-sectional view of an illustrative wafer portion 100 at an early stage of manufacturing. At the point of fabrication depicted in FIG. 1A, various layers of semiconductor material 2, 3, 4, 5, 6 and 7 were formed above a substrate 1. In at least one embodiment, the substrate 1 is comprised of silicon. Additionally, a patterned mask layer 8 was formed above the top layer 7 of semiconductor material. In at least one embodiment, the mask layer 8 is a hard mask, such as a patterned layer of silicon nitride. In general, in the depicted example, the layers 2, 4 and 6 are made of a semiconductor material that may be selectively removed or etched relative to the materials used for the semiconductor material layers 3, 5 and 7. As described more fully below, portions of the semiconductor material layers 2, 4 and 6 will be removed while the semiconductor material layers 3, 5 and 7 will be left in place. Thus, portions of the semiconductor material layers 2, 4 and 6 are sacrificial in nature. The semiconductor materials layers 2, 3, 4, 5, 6 and 7 may include a variety of different materials such as, for example, silicon, doped silicon, silicon/germanium, a III-V material, germanium, etc., and they may be formed to any desired thickness by performing any appropriate process, e.g., an epitaxial growth process, deposition plus ion implantation, etc. In at least one embodiment, the semiconductor material layers 2, 4 and 6 may be made from silicon/germanium, while the semiconductor material layers 3, 5 and 7 may be made from silicon. In at least one embodiment, semiconductor material layer 2 includes a different material than semiconductor material layer 4, and both include a different material than semiconductor material layer 6.

Figure 1B:
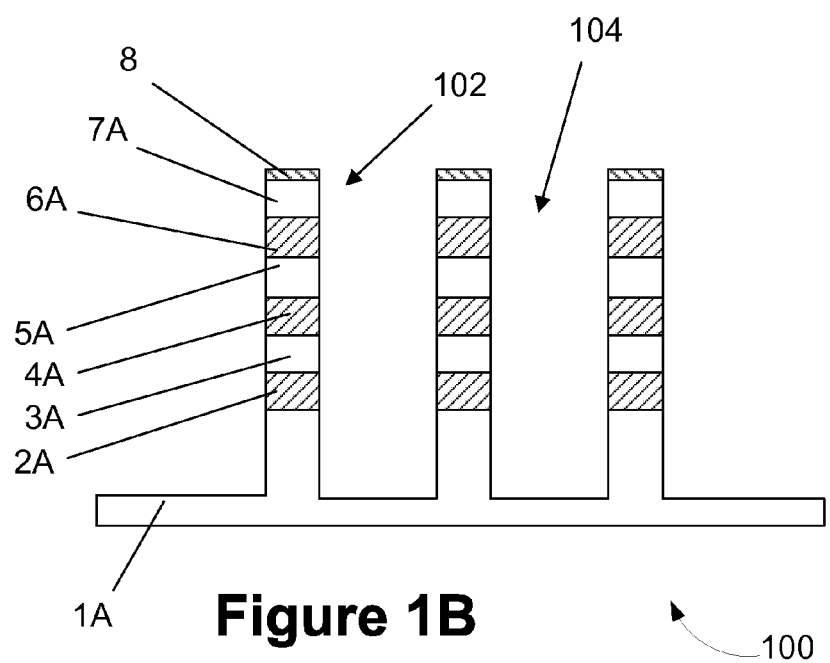

Next, as shown in FIG. 1B, one or more etching processes were performed through the patterned etch mask 8 to form a plurality of trenches 104 by removing the exposed portions of the semiconductor material layers 2, 3, 4, 5, 6 and 7 that were not covered by the mask layer 8, thus forming the etched semiconductor layers 2A, 3A, 4A, 5A, 6A and 7A. In at least one embodiment, the trenches 104 extend into the substrate 1, thus forming etched substrate 1A. The view in FIG. 1B is a cross-sectional view taken in the gate width direction of the final FinFET device. That is, when the device is completed, the direction of current flow in the device will be in a direction that is perpendicular to the plane of the drawing page of FIG. 1B. The etching processes may include dry etching and wet etching techniques to remove materials from the wafer portion 100. Dry etching may include plasma etching, ion beam etching, reactive ion etching and the like. The formation of the trenches 104 defines fins 102 on top of the etched substrate 1A, and each fin 102 includes the etched semiconductor material layers, 2A, 3A, 4A, 5A, 6A and 7A.

Figure 1C:
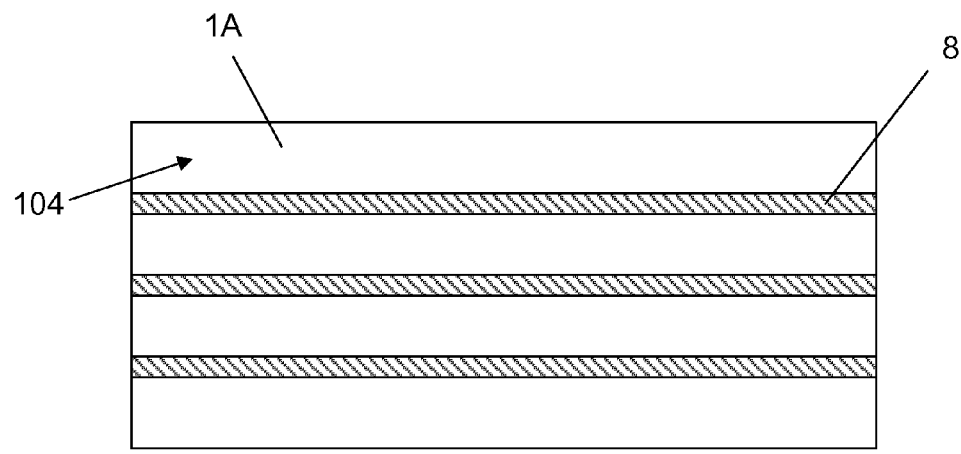

FIG. 1C illustrates a top view of FIG. 1B that has been rotated ninety degrees. The mask layer 8 runs horizontally across the wafer portion 100, and the etched substrate 1A is exposed due to the formation of trenches 104 in sections of the wafer portion 100 not covered by the mask 8.

Figure 1D:
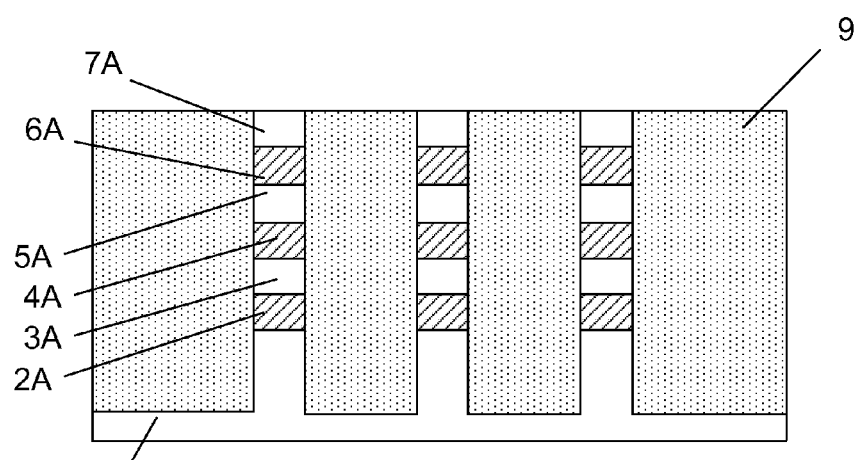

FIG. 1D illustrates a side view of the wafer portion 100 after several processes were performed. First, the trenches 104 were overfilled with an insulating material 9 by performing one or more deposition processes. In at least one embodiment, the insulating material 9 may include a low-k material (a material having a dielectric constant less than about 3) or a material such as silicon dioxide. Next, a planarization process (CMP) was performed using the top layer of the semiconductor material 7A as a polish-stop. As such, any excess insulating material 9 and the mask layer 8 were removed from the wafer portion 100, leaving the etched semiconductor material layer 7A exposed.

Figure 1E:
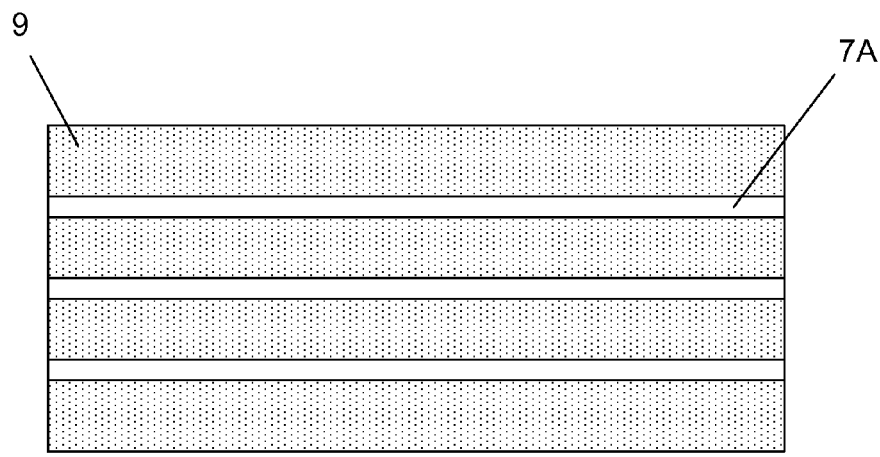

FIG. 1E illustrates a top view of FIG. 1D rotated ninety degrees. In the depicted example, the top layer of semiconductor material 7A (and the fins 102) runs horizontally across the wafer portion 100 and is flanked on the top and bottom sides by the insulating material 9 positioned in the trenches 104.

Figure 1F:
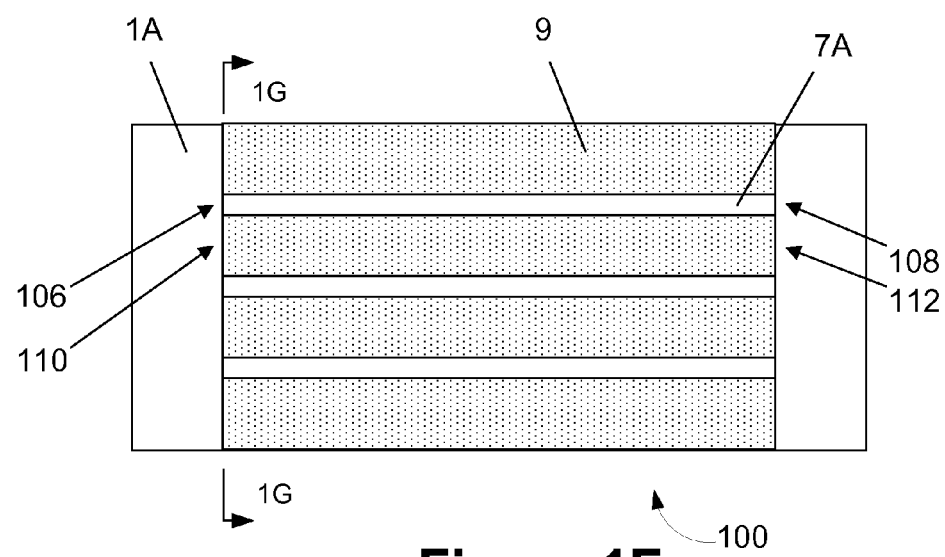

FIG. 1F illustrates the wafer portion 100 of FIG. 1E after several processes were performed. A masking layer (not shown) was formed above the device 100 so as to cover the middle portions of the fin structures 102 and expose end portions of the fin structures 102. Thereafter, an etching process was performed on both horizontal ends of the wafer portion 100 to expose a first end surface 106 and a second end surface 108 of the layers of etched semiconductor material 2A, 3A, 4A, 5A, 6A and 7A. The etching process also exposed a first end surface 110 and second end surface 112 of the insulating material 9. As a result, the etched substrate 1A is exposed on the horizontal ends of the wafer portion 100, and the axial lengths of the fins, topped by the etched semiconductor layer 7A, are defined. Next, a cross-section at the location of the line labeled 1G will be described.

Figure 1G:
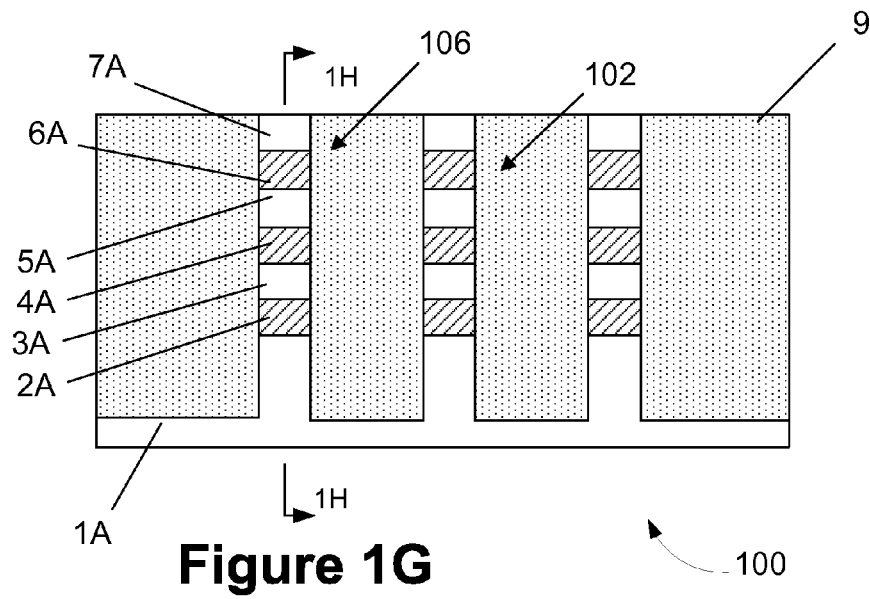

FIG. 1G is a cross-sectional view of the wafer portion 100 taken where indicated in FIG. 1F and shows the exposed end surface 106. Each fin 102 includes the etched semiconducting layers 2A, 3A, 4A, 5A, 6A and 7A positioned on the etched substrate 1A. The fins 102 are laterally separated by the insulating material 9, which is positioned above the etched substrate 1A in the trenches 104. Next, a cross-section at the location of the line labeled 1H will be described.

Figure 1H:
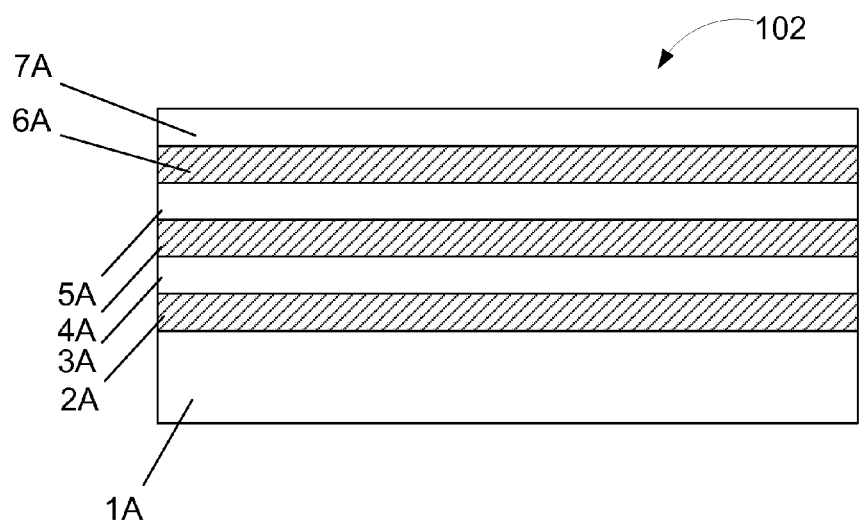

FIG. 1H illustrates a cross-section of one of the fins 102 taken where indicated in FIG. 1G, i.e., taken through the long axis (or current transport direction) of one of the fins 102. The fin 102 includes the etched layers of semiconductor material 2A, 3A, 4A, 5A, 6A and 7A positioned on the etched substrate 1A.

Figure 1I:
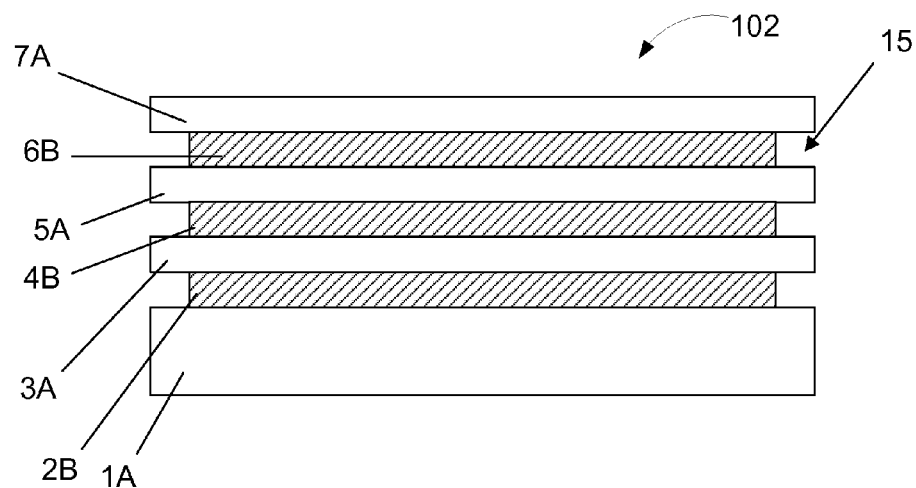

FIG. 1I illustrates the fin 102 of FIG. 1H after one or more processes were performed. Specifically, one or more recess etching processes were performed to form recessed semiconductor layers 2B, 4B and 6B relative to the layers 3A, 5A and 7A. Consequently, a plurality of cavities 15 were formed on opposite ends of the layers 2B, 4B and 6B. The cavities 15 are defined by the recessed layers 2B, 4B and 6B, the non-recessed layers 3A, 5A and 7A, and the etched substrate 1A.

Figure 1J:
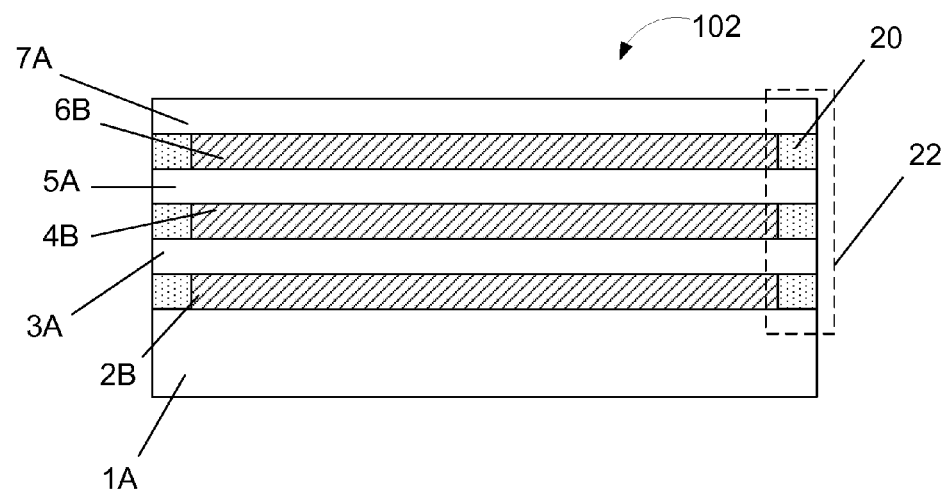

FIG. 1J illustrates the fin 102 of FIG. 1I after one or more processes were performed. Specifically, one or more deposition processes were performed so as to fill the cavities 15 shown in FIG. 1I with an epi semiconductor material to form support structures 20. The support structures 20 are formed on both horizontal ends of the fin 102, and the support structures 20 are positioned vertically adjacent to the portions of the non-recessed layers 3A, 5A and 7A, i.e., the end portions of the non-recessed layers 3A, 5A and 7A. Collectively, the support structures 20 and the vertically adjacent end portions of the non-recessed layers 3A, 5A and 7A define one or more "pillars" 22. As such, the pillars 22 include a continuous and vertical length of semiconductor material on opposite ends of the fin 102 that will support the fin 102 during subsequent processing operations. In at least one embodiment, the support structures 20 may be made of the same semiconductor material as the non-recessed semiconductor layers 3A, 5A and 7A. In at least one embodiment, the support structures 20 on one side of the fin 102 are formed separately from the support structures on the other side of the fin 102.

Figure 1K:
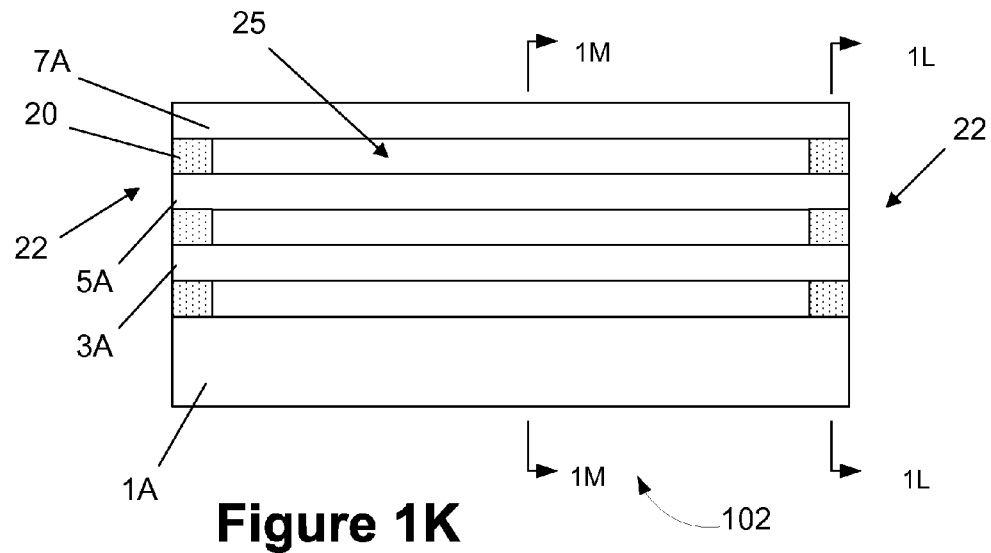

FIG. 1K illustrates the fin 102 of FIG. 1J after one or more processes were performed. Specifically, one or more etching processes were performed to remove the recessed layers 2B, 4B and 6B of FIG. 1J, thus creating openings or spaces 25 between the non-recessed layers 3A, 5A and 7A. The pillars 22, which include the support structures 20, provide support for the remaining materials 7A, 5A and 3A after the spaces 25 were formed. Cross-sectional views taken at the location of the lines labeled 1L and 1M will be described below.

Figure 1L:
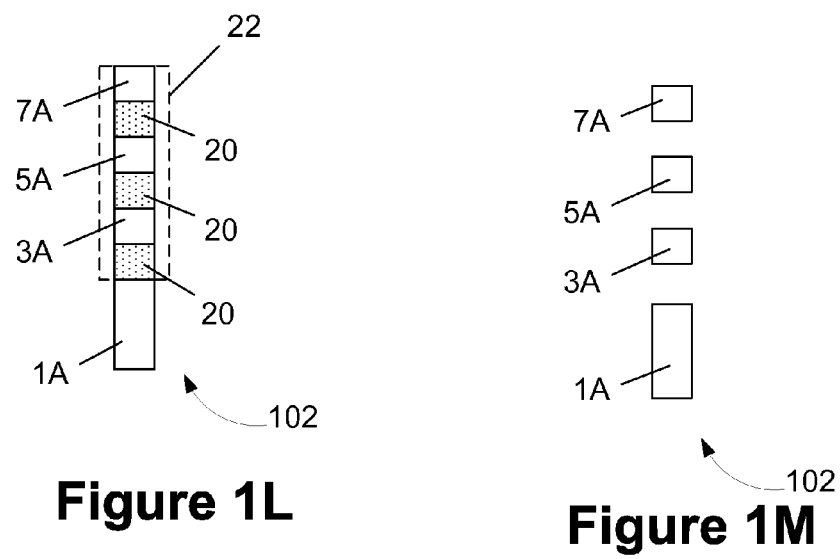

FIG. 1L is a cross-sectional view of one of the fins 102 taken at the line labeled 1L on FIG. 1K. The pillar 22 includes support structures 20 and the vertically adjacent end portions of the non-recessed semiconductor layers 3A, 5A and 7A. The pillar 22 is positioned above the etched substrate 1A.

Figure 1M:
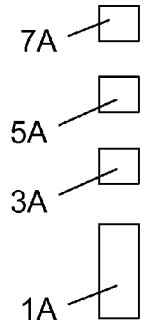

FIG. 1M is a cross-sectional view of one of the fins 102 at the line labeled 1M on FIG. 1K. At this location of the fin 102, only the etched substrate 1A and the etched semiconductor layers 3A, 5A and 7A, now nanowires, appear in the cross-section. The nanowires are supported by the pillars 22 shown in FIG. 1L at opposite ends of the fin 102.

Figure 1N:
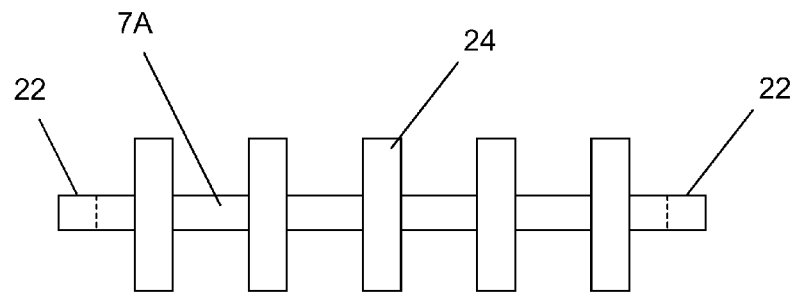

FIG. 1N illustrates a top view of one of the fins 102 after several processes were performed. In this view, only the top semiconductor layer 7A of the fin 102 is visible. This top layer 7A is also the top of the pillar 22 (one side of which is represented by the dashed line for clarity) that provides support for the channel structure. Multiple gates 24 were formed over the fin, and each gate may include a gate electrode, a gate insulation layer and a gate cap in various embodiments.

Figure 1O:
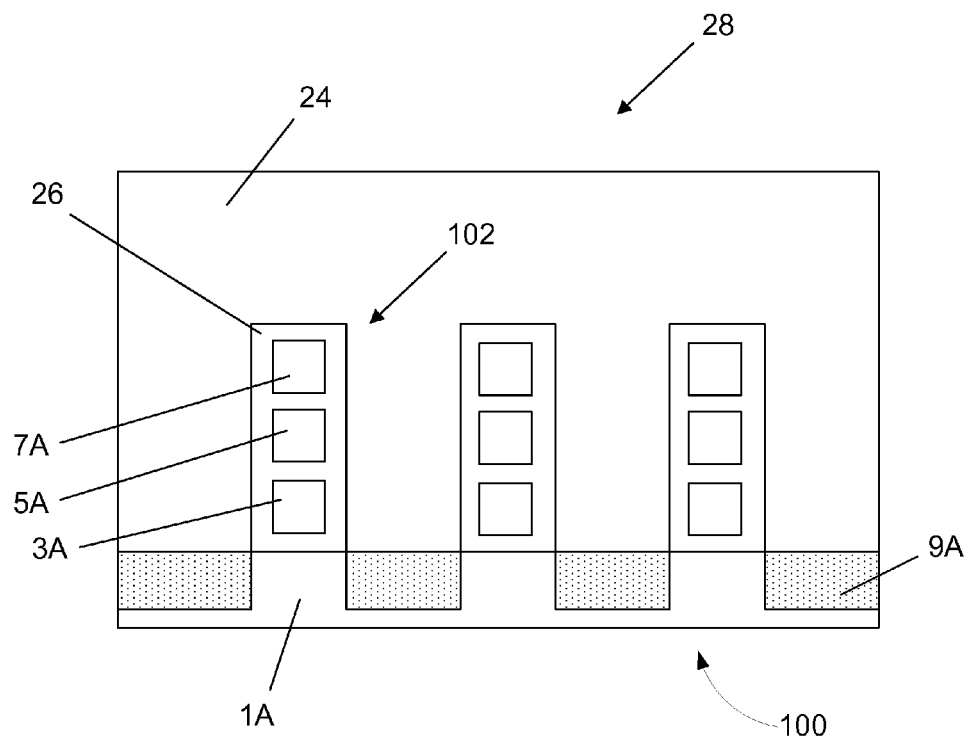

FIG. 1O illustrates a cross-sectional view of the wafer portion 100 after an illustrative gate structure 28 was formed around three illustrative fins 102. The depicted view is taken through the gate in the gate-width direction of the device. More specifically, a high-k gate insulation material 26 (material having a dielectric constant greater than about 10) was deposited onto the nanowires 3A, 5A and 7A by performing one or more deposition processes. In at least one embodiment, this material 26 filled the openings 25 created by removal of the recessed layers 2B, 4B and 6B, as shown in FIGS. 1J and 1K. Additionally, a gate electrode 24 was formed around the fins 102 and the gate insulation material 26. The gate structure 28 may be formed using well-known gate-first or replacement gate manufacturing techniques. The support structures 20 of FIG. 1M may be removed after the formation of the gate structures 28 in at least one embodiment. In another embodiment, the pillars 22 were removed after gate 24 formation. For example, one or more etching processes may be performed to remove the support structures 20 or pillars 22. At this point in the process flow, traditional manufacturing process operations may be performed to complete the device.

Figure 2:
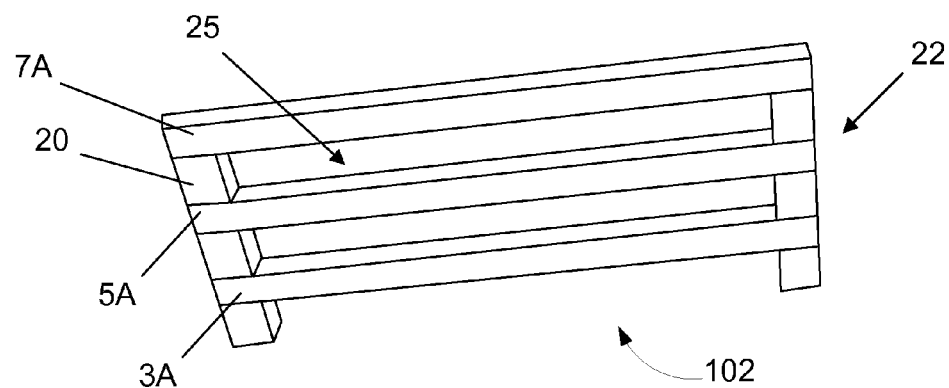
FIG. 2 depicts an illustrative embodiment of the semiconductor fin support structures.

FIG. 2 illustrates a three dimensional view of the fin 102 of FIG. 1J (the substrate 1A is not shown) after one or more processes were performed. Specifically, one or more etching processes were performed to remove the recessed layers 2B, 4B and 6B of FIG. 1J, thus creating openings or spaces 25 between the non-recessed layers 3A, 5A and 7A. The pillars 22, which include the support structures 20, provide support for the remaining materials 7A, 5A and 3A after the spaces 25 were formed.

Figure 3A:
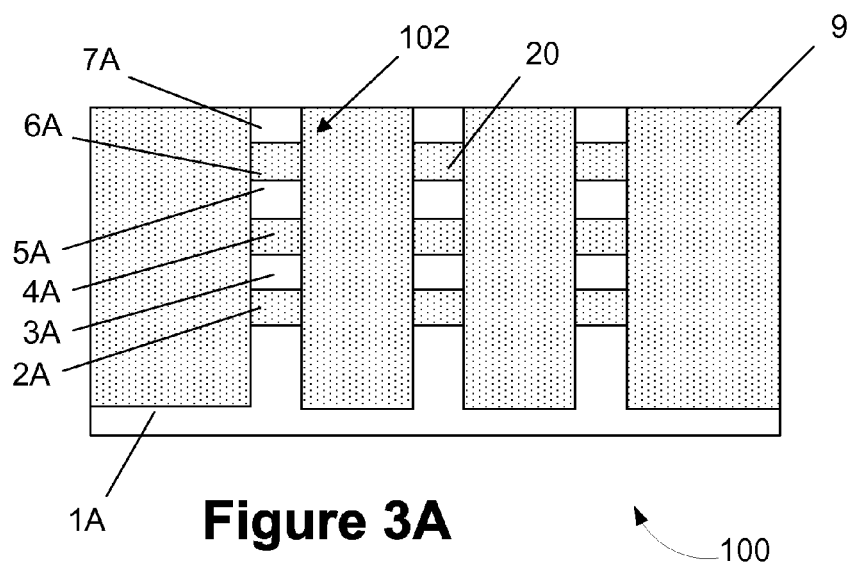
FIGS. 3A-3B depict an illustrative method of forming semiconductor fin support structures.

FIG. 3A illustrates a side view of the wafer portion 100 of FIG. 1C after several processes were performed. First one or more etching processes were performed to recess the semiconductor layers 2A, 4A and 6A. Next, the trenches 104 and recesses were overfilled with an insulating material 9 by performing one or more deposition processes. In at least one embodiment, the insulating material 9 may include a low-k material (a material having a dielectric constant less than about 3) or a material such as silicon dioxide. As such, the support structures 20 may include an oxide material. Next, a planarization process (CMP) was performed using the top layer of semiconductor material 7A as a polish-stop. As such, any excess insulating material 9 and the mask layer 8 were removed from the wafer portion 100 leaving the etched semiconductor layer 7A exposed.

Figure 3B:
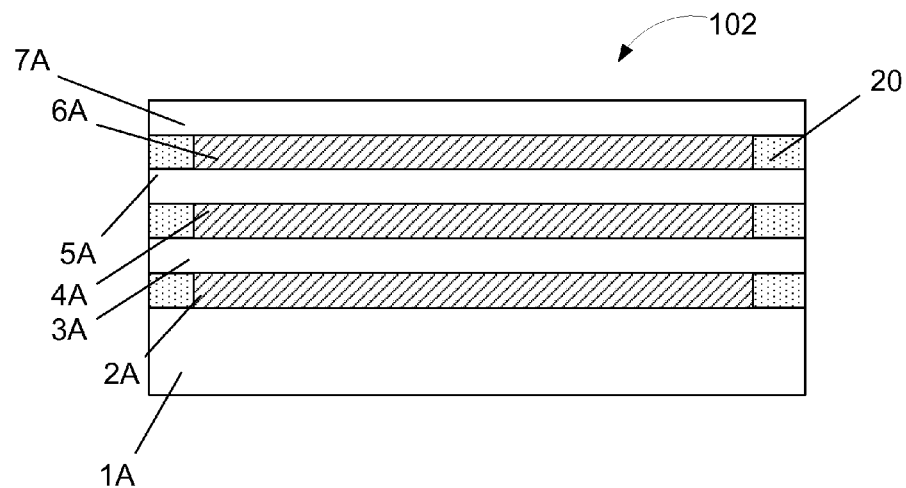

FIG. 3B illustrates a cross-section of one of the fins 102 of FIG. 3A taken through the long axis (or current transport direction) of one of the fins 102. The support structures 20 fill the recesses of the recessed semiconductor layers 2A, 4A and 6A. The fin 102 also includes the layers of semiconductor material 3A, 5A and 7A positioned on the etched substrate 1A. Processing of this embodiment may occur as described above with reference to FIGS. 1A-1O.

Figure 4A:
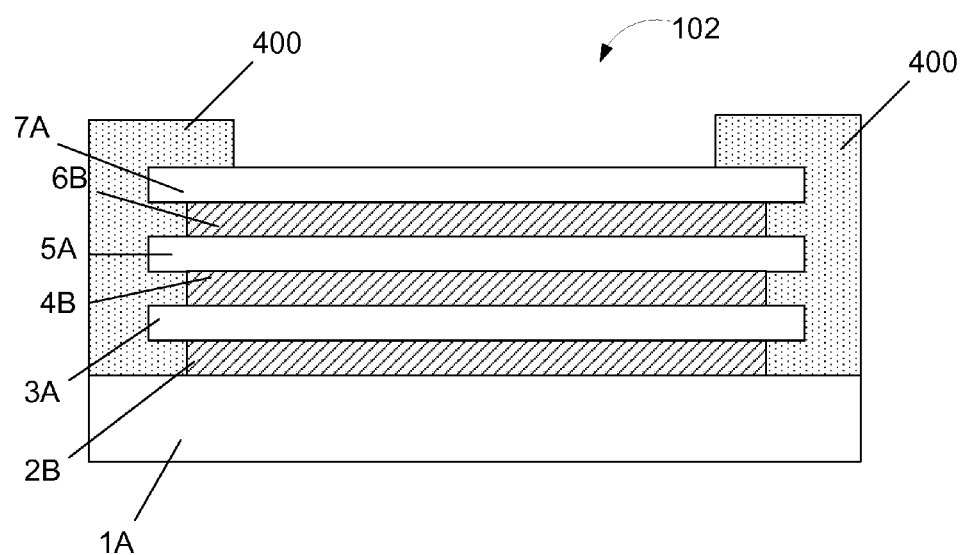
FIGS. 4A-4D depict an illustrative method of forming semiconductor fin support structures.
Figure 4B:
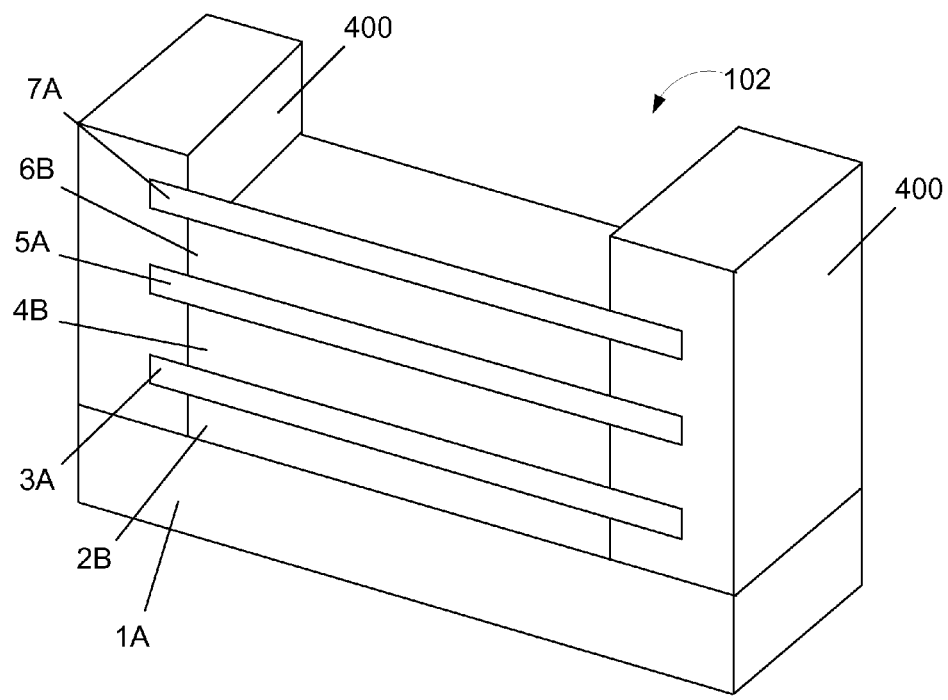

FIG. 4A illustrates the fin 102 of FIG. 1I after one or more processes were performed. Specifically, one or more deposition processes were performed so as to overfill the cavities 15 shown in FIG. 1I with an oxide semiconductor material 400 in at least one embodiment. FIG. 4B illustrates a three-dimensional view of the fin 102 of FIG. 4A.

Figure 4C:
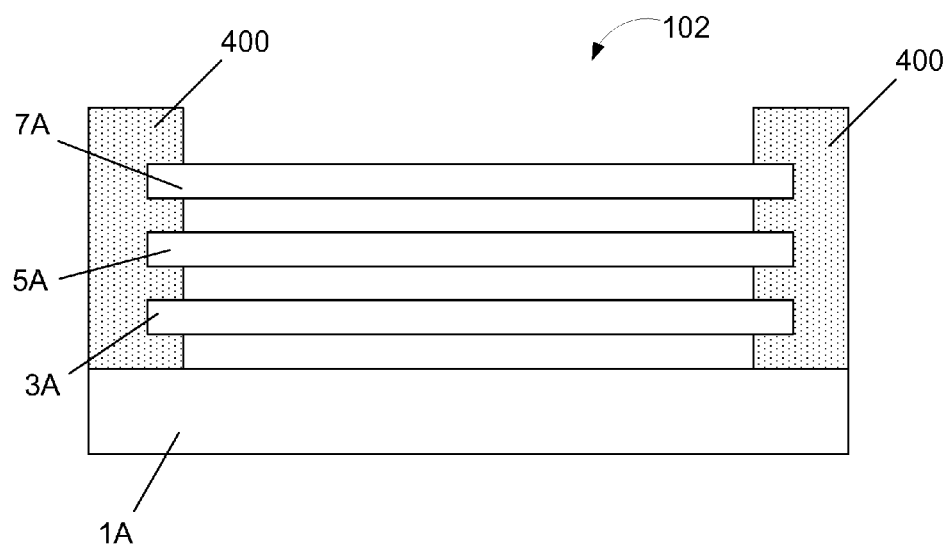

FIG. 4C illustrates the fin 102 of FIG. 4A after one or more processes were performed. Specifically, one or more etching processes were performed to remove the layers 2B, 4B and 6B. The deposited material 400 supports the remaining layers 3A, 5A and 7A positioned above the substrate 1A.

Figure 4D:
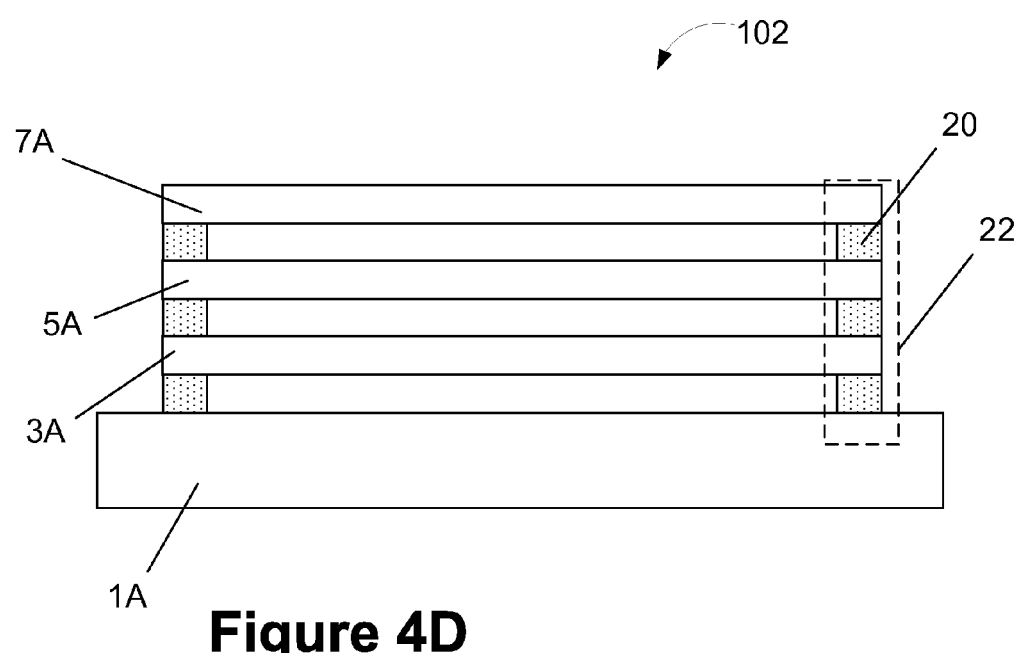

FIG. 4D illustrates the fin 102 of FIG. 4C after one or more processes were performed. Specifically, one or more polishing or etching processes were performed on the deposited material 400 of FIG. 4C to form support structures 20. The support structures 20 are formed on one or both horizontal ends of the fin 102, and the support structures 20 are positioned vertically adjacent to the portions of the non-recessed layers 3A, 5A and 7A, i.e., the end portions of the non-recessed layers 3A, 5A and 7A. Collectively, the support structures 20 and the vertically adjacent end portions of the non-recessed layers 3A, 5A and 7A define a "pillar" 22. As such, the pillar 22 will support the fin 102 during subsequent processing operations. Using the above-described procedures, support structures 20 may be formed on opposite ends of the fin 102 separately or simultaneously. Processing may then continue as described above with reference to FIGS. 1A-1O.

In the examples described herein, the fins 102 are depicted as including three illustrative nanowires 3A, 5A and 7A.

However, the fins 102 may include any desired number of nanowires and in some cases may include only a single nanowire. Thus, the disclosure should not be considered as being limited to any particular number of nanowires. Moreover, a device may include any number of the fins 102.

The particular embodiments disclosed above are illustrative only, as the disclosure may be modified and practiced in different but equivalent manners apparent to those having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

What is claimed:

1. A method, comprising:
    forming a plurality of trenches that define a fin structure comprising a first layer of a first semiconductor material and a second layer of a second semiconductor material positioned above a substrate, wherein said first and second semiconductor materials are selectively etchable relative to one another;
    performing at least one etching process that exposes opposing end surfaces of said first and said second layers;
    performing at least one recess etching process that removes end portions of said first layer and defines a cavity on opposite ends of said first layer, said cavities being positioned vertically adjacent to end portions of said second layer;
    performing an epitaxial deposition process that fills each of said cavities with a support structure comprising a third semiconductor material; and
    performing an etching process to selectively remove remaining portions of the recessed first layer relative to said second layer and said support structures, wherein the end portions of said second layer and said support structures define pillars on opposite ends of said fin structure.

2. The method of claim 1, further comprising removing said support structures after forming a gate structure around said second layer.

3. The method of claim 1, wherein forming said plurality of trenches comprises forming said plurality of trenches such that they extend into said substrate.

4. The method of claim 1, wherein performing said at least one etching process comprises defining an axial length of said fin structure.

5. The method of claim 1, further comprising filling an opening created by removal of the recessed first layer with an insulating material.

6. The method of claim 1, wherein said first layer comprises one of silicon or silicon germanium and said second layer comprises the other of silicon or silicon germanium.

7. The method of claim 1, wherein said first and third semiconductor materials comprise the same semiconductor material.

8. A method, comprising:
    forming a fin structure comprising a first layer of a first semiconductor material and a second layer of a second semiconductor material;
    performing at least one recess etching process that removes end portions of said first layer and defines a cavity on opposite ends of said first layer, said cavities being positioned vertically adjacent to end portions of said second layer;

performing an epitaxial deposition process that fills each of said cavities with a support structure comprising a third semiconductor material; and performing an etching process to selectively remove remaining portions of the recessed first layer relative to said second layer and said support structures, wherein the end portions of said second layer and said support structures define pillars on opposite ends of said fin structure.

9. The method of claim 8, further comprising removing said support structures after forming a gate structure around said second layer.

10. The method of claim 8, further comprising removing said pillars after forming a gate structure around said second layer.

11. The method of claim 8, further comprising forming a plurality of trenches that extend into a substrate so as to define said fin structure.

12. The method of claim 8, further comprising performing at least one etching process that exposes opposing end surfaces of said first and said second layers.

13. The method of claim 8, wherein performing said at least one etching process defines an axial length of said fin structure.

14. The method of claim 8, further comprising filling an opening created by removal of the recessed first layer with an insulating material.

15. The method of claim 8, wherein said first layer comprises one of silicon or silicon germanium and said second layer comprises the other of silicon or silicon germanium.

16. The method of claim 8, wherein said first and third semiconductor materials comprise the same semiconductor material.

17. A method, comprising:

forming a plurality of trenches that define a fin structure comprising a first layer of a first semiconductor material and a second layer of a second semiconductor material positioned above a substrate, wherein the first and second semiconductor materials are selectively etchable relative to one another;

performing at least one etching process that exposes opposing end surfaces of said first and said second layers;

performing at least one recess etching process that removes end portions of said first layer and defines a cavity on opposite ends of said first layer, said cavities being positioned vertically adjacent to end portions of said second layer;

performing an epitaxial deposition process that fills each of said cavities with a support structure comprising a third semiconductor material that is the same as said first semiconductor material; and performing an etching process to selectively remove remaining portions of the recessed first layer relative to said second layer and said support structures.

18. The method of claim 17, further comprising removing said support structures after removing the recessed first layer.

19. The method of claim 17, further comprising forming a gate structure around said second layer, wherein the end portions of said second layer and said support structures define pillars on opposite ends of said fin structure, and removing said pillars.

20. The method of claim 17, wherein performing said at least one etching process comprises defining an axial length of the fin structure.

* * * * *